United States Patent
Reddy (10) Patent No.: US 8,575,979 B2
(45) Date of Patent: Nov. 5, 2013

(54) FULLY DIFFERENTIAL ADAPTIVE BANDWIDTH PLL WITH DIFFERENTIAL SUPPLY REGULATION

(75) Inventor: Chandrashekar Reddy, Medak (IN)

(73) Assignee: Conexant Systems, Inc., Irvine, CA (US)

( * ) Notice: Subject to any disclaimer, the term of this patent is extended or adjusted under 35 U.S.C. 154(b) by 123 days.

(21) Appl. No.: 13/066,731

(22) Filed: Apr. 21, 2011

(65) Prior Publication Data

US 2012/0268178 A1    Oct. 25, 2012

(51) Int. Cl.
    *H03L 7/06*    (2006.01)
(52) U.S. Cl.
    USPC .............. 327/156; 327/147; 331/17; 375/376
(58) Field of Classification Search
    USPC ............ 327/146–148, 155–157; 331/1 R, 17; 375/373, 374, 376
    See application file for complete search history.

(56) References Cited

U.S. PATENT DOCUMENTS

| | | | | |
|---|---|---|---|---|
| 5,781,048 | A * | 7/1998 | Nakao et al. ................ | 327/157 |
| 5,936,445 | A * | 8/1999 | Babanezhad et al. ........ | 327/157 |
| 6,011,822 | A | 1/2000 | Dreyer | |
| 6,434,206 | B1 * | 8/2002 | Yu ................................ | 375/376 |
| 6,466,097 | B1 * | 10/2002 | Celant et al. .................... | 331/17 |
| 6,792,062 | B2 * | 9/2004 | Vaucher ........................ | 375/374 |
| 7,184,510 | B2 * | 2/2007 | Jung .............................. | 375/374 |
| 7,355,486 | B2 * | 4/2008 | Kelkar et al. .................... | 331/16 |
| 2002/0114416 | A1 * | 8/2002 | Enam et al. ................... | 375/373 |
| 2009/0261909 | A1 * | 10/2009 | Fujino ............................. | 331/17 |
| 2009/0289725 | A1 | 11/2009 | Fu | |

OTHER PUBLICATIONS

"Practical Phase-Locked Loop Design" 2004 ISSCC Tutorial, Dennis Fischette 131 Pgs.
"Low-Jitter Process-Independent DLL and PLL Based on Self-Biased Techniques" John G. Maneatis. IEEE Journal of Solid-State Circuits, vol. 31, No. 11, Nov. 1996. 10 Pgs.
"Low-Jitter Process-Independent DLL and PLL Based on Self-Biased Techniques" John G. Maneastis. ISSCC96/ Session 8/ Digital Clocks and Latches/ Paper FA 8.1. 1996. 3 Pgs.
"Design of a Charge-Pump PLL for LVDS SerDes" Jianbin Pan & Yuanfu Zhao. Proceedings of the International MultiConference of Engineers an Computer Scientists 2010 vol. II, IMECS 2010, Mar. 17-19, 2010, Hong Kong. 4 Pgs.
"Design and Analysis of an Ultrahigh-Speed Glitch-Free Fully Differential Charge Pump with Minimum Output Current Variation and Accurate Matching" S. Cheng, H. Tong, J. Silva-Martinez and A. Karsilayan. IEEE Transactions on Circuits and Systems, part II, vol. 53, pp. 843-847, Sep. 2006, 3 Pgs.
"Adaptive Bandwith DLLs and PLLs using Regulated Supply CMOS Buffers" Stefanos Sidiropoulos, Dean Liu, Jaeha Kim, Guyeon Wei, and Mark Horowitz. 2000 Symposium on VLSI Circuits Digest of Technical Papers. 4 Pgs.

* cited by examiner

*Primary Examiner* — Patrick O'Neill
(74) *Attorney, Agent, or Firm* — Farjami & Farjami LLP (57) ABSTRACT

Provided is a fully differential adaptive bandwidth phase locked loop with differential supply regulation. One fully differential phase locked loop includes a differential active loop filter and regulator coupled to an output of a differential charge pump, a differential voltage-controlled oscillator coupled to differential control voltages developed by the differential active loop filter and regulator, and a bias circuit coupled to the differential control voltages and providing a bias current to the differential charge pump.

20 Claims, 4 Drawing Sheets

FULLY DIFFERENTIAL ADAPTIVE BANDWIDTH PLL WITH DIFFERENTIAL SUPPLY REGULATION

BACKGROUND OF THE INVENTION

1. Field of the Invention

The present invention relates generally to semiconductor devices. More particularly, the present invention relates to phase locked loop (PLL) implementations for semiconductor devices.

2. Background Art

Phase locked loops (PLLs) are used throughout the electronic device industry in a variety of circumstances, from tuning radio receivers to a particular frequency band to generating precise synthesized tones for musical equipment. In particular, PLLs may be used to clean and propagate a clock signal or a multiple of a clock signal throughout a computational device.

Typically, PLLs accept a provided reference signal and "lock" to the frequency and phase of the provided reference signal after a settling period, where the feedback loop of the PLL incrementally adjusts an operating frequency of the PLL until a PLL feedback signal matches the reference signal's frequency and phase. The stability of a particular PLL depends on its ability to lock to a particular reference signal frequency, and so depends on the loop bandwidth and damping factor of the PLL, where too little or too much bandwidth or too long a settling period may lead to unstable operation. For example, a PLL's loop bandwidth should be sufficiently large to reduce input tracking jitter and to allow for lock to a wide range of reference signal frequencies, but too large a loop bandwidth allows off-frequency noise to encroach into the operation of the PLL, which introduces errors into the operating frequency of the PLL. Similarly, a damping factor that varies with operating frequency can introduce errors into the operating frequency of the PLL that limits its utility to a relatively narrow operating frequency range. Because contemporary PLLs are often required to lock to relatively wide ranges of reference signal frequencies, bandwidth and damping related PLL operating frequency errors have become a significant problem.

Conventional methods to address these problems include adaptive bandwidth loop filter implementations, where loop bandwidth follows operating frequency so as to limit input noise without necessarily limiting an operating frequency range, and where a damping factor is kept reasonably constant over a selected operating frequency range, but these implementations are typically complex and require a relatively large amount of die space to fabricate. Furthermore, these implementations also typically introduce or at least do not fully address other sources of errors in an operating frequency of a PLL, such as decreased jitter performance due to supply or common mode noise and substrate noise.

Accordingly, there is a need to overcome the drawbacks and deficiencies in the art by providing a compact PLL implementation with an increased jitter performance and increased operating frequency range.

SUMMARY OF THE INVENTION

The present application is directed to a fully differential adaptive bandwidth phase locked loop (PLL) with differential supply regulation, substantially as shown in and/or described in connection with at least one of the figures, as set forth more completely in the claims.

BRIEF DESCRIPTION OF THE DRAWINGS

The features and advantages of the present invention will become more readily apparent to those ordinarily skilled in the art after reviewing the following detailed description and accompanying drawings, wherein.

DETAILED DESCRIPTION OF THE INVENTION

The present application is directed to a fully differential adaptive bandwidth phase locked loop (PLL) with differential supply regulation. The following description contains specific information pertaining to the implementation of the present invention. One skilled in the art will recognize that the present invention may be implemented in a manner different from that specifically discussed in the present application. Moreover, some of the specific details of the invention are not discussed in order not to obscure the invention. The specific details not described in the present application are within the knowledge of a person of ordinary skill in the art.

The drawings in the present application and their accompanying detailed description are directed to merely exemplary embodiments of the invention. To maintain brevity, other embodiments of the invention, which use the principles of the present invention, are not specifically described in the present application and are not specifically illustrated by the present drawings. Unless noted otherwise, like or corresponding elements among the figures may be indicated by like or corresponding reference numerals. Moreover, the drawings and illustrations in the present application are generally not to scale, and are not intended to correspond to actual relative dimensions.

Figure 1:
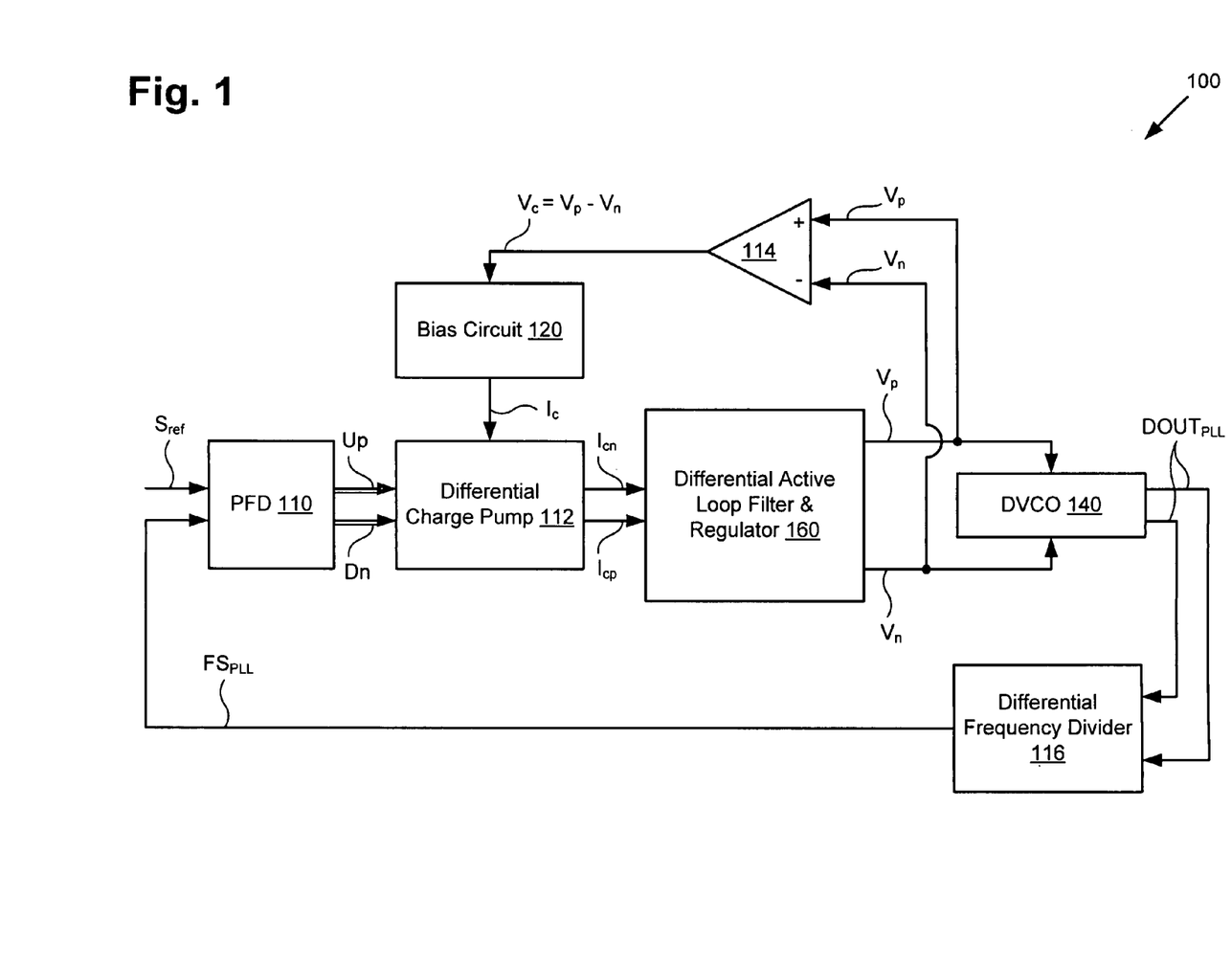
FIG. 1 presents a diagram of a fully differential adaptive bandwidth phase locked loop (PLL) with differential supply regulation, according to one embodiment of the present invention.

FIG. 1 shows fully differential PLL 100 configured to produce a PLL feedback signal $FS_{PLL}$ having substantially the same frequency and phase as reference signal $S_{ref}$, as measured at phase frequency detector (PFD) 110. As shown in FIG. 1, fully differential PLL 100 includes PFD 110, differential charge pump 112, subtractor 114, differential frequency divider 116, bias circuit 120, differential voltage controlled oscillator 140 and differential active loop filter and regulator (DALFR) 160. Although the embodiment of the present inventive concepts illustrated by FIG. 1 is presented incorporating each of the above elements, it should be understood that other embodiments may lack one or more of the listed elements, or include other elements. For example, fully differential PLL 100 may include a signal mixer instead of differential frequency divider 116, for example, or may simply lack differential frequency divider 116. Furthermore, although each of the elements of fully differential PLL 100 may be integrated into the same semiconductor die, for example, to reduce size and power consumption, or to reduce susceptibility to noise, for instance, other embodiments may comprise elements fabricated separately. In some embodiments, fully differential PLL 100 may be integrated with many other devices on a single semiconductor die, for example.

Under normal operation, a reference signal $S_{ref}$ having a reference frequency and reference phase may be input into PFD 110, as shown in FIG. 1. PFD 110 may comprise any circuitry capable of comparing a frequency and phase of a reference signal such as $S_{ref}$ to the frequency and/or phase of a PLL feedback signal such as $FS_{PLL}$, for example, and producing differential control signals that can be used to produce a PLL feedback signal having substantially the same frequency and phase as the reference signal, as measured by PFD 110, for example. In some embodiments, PFD 110 may be configured to compare frequency and phase of a differential reference signal and a differential PLL feedback signal. For instance, PFD 110 may compare reference signal $S_{ref}$ to PLL feedback signal $FS_{PLL}$ and provide differential control signals Up and Dn, for example, configured to communicate a relative phase error, for instance, to differential charge pump 112. Differential control signals Up and Dn may comprise any series or combination of electrical signals or waveforms configured to indicate to differential charge pump 112 whether and/or how much a frequency of PLL feedback signal $FS_{PLL}$, for example, should be increased or decreased to substantially match a phase and/or frequency of reference signal $S_{ref}$. As shown in FIG. 1, differential control signal Up may comprise two differential signals Up+ and Up−, and differential control signal Dn may comprise two differential signals Dn+ and Dn−, for a total of four signals differentially coupling PFD 110 to differential charge pump 112.

Differential charge pump 112 may comprise any circuitry capable of accepting bias current and differential control signals Up and Dn, for example, and producing differential bias currents $I_{cn}$ and $I_{cp}$ that may, in turn, be used by DALFR 160, for example, to develop differential control voltages $V_p$ and $V_n$, as will be explained more fully below. In some embodiments, bias currents $I_{cn}$ and $I_{cp}$ may be configured to be proportional to bias current $I_c$, for example, and have waveforms that are otherwise substantially similar to waveforms of differential control signals Up and Dn, for instance. For example, in one embodiment, differential charge pump 112 may comprise a fully differential all N type Metal Oxide Semiconductor (NMOS) charge pump.

In such embodiment, restricting differential charge pump 112 to all NMOS devices may significantly reduce its overall size relative to alternative embodiments where, for example, differential charge pump 112 includes at least one PMOS device that may itself include a relatively large P-type well in an N type substrate, for example. In other embodiments, differential charge pump 112 may comprise all P type MOS (PMOS) devices where, for example, fully differential PLL 100 is formed on a P type substrate. A differential charge pump, such as differential charge pump 112 in FIG. 1 for example, comprising all the same type devices, either all NMOS or all PMOS, may be configured to provide similar loading to all outputs of PFD 110, for instance, thereby reducing a mismatch current that can otherwise arise from charge pump configurations having both type devices, for example, and lead to reference jitter at a PLL output. In alternative embodiments, fully differential current steering architectures may be used to implement differential charge pump 112. In each embodiment of fully differential PLL 100, however, differential charge pump 112 comprises only a single differential charge pump, and so fully differential PLL 100 comprising differential charge pump 112 is substantially smaller and less complex to fabricate than other PLL implementations, such as conventional adaptive bandwidth PLL implementations.

DALFR 160 may comprise any circuitry capable of accepting bias currents $I_{cn}$ and $I_{cp}$ and developing differential control voltages $V_p$ and $V_n$ used to control a frequency of differential signal $DOUT_{PLL}$ produced by DVCO 140, for example. As will be described more fully below with reference to FIG. 2, DALFR 160 may be configured to actively filter bias currents $I_{cn}$ and $I_{cp}$ so as to provide, in conjunction with other elements of fully differential PLL 100, a substantially constant ratio of loop bandwidth to operating frequency for fully differential PLL 100, for example. Moreover, DALFR 160, in conjunction with other elements of fully differential PLL 100, may also be configured to provide a substantially constant damping factor for fully differential PLL 100. By keeping both a ratio of loop bandwidth to operating frequency and a damping factor substantially constant over an operating frequency range of fully differential PLL 100, a jitter performance for fully differential PLL 100 is substantially improved. Moreover, by keeping both constant over a wide range of operating frequencies, stability for fully differential PLL 100 is substantially improved, and fully differential PLL 100 may be configured to lock to a relatively wide range of input reference signal frequencies, for example.

As shown in FIG. 1, differential control voltages $V_p$ and $V_n$ developed by DALFR 160 may be coupled to DVCO 140, for example, in order for DVCO 140 to produce differential signal $DOUT_{PLL}$ having a frequency proportional to, for example, a difference between differential control voltages $V_p$ and $V_n$. In addition, differential control voltages $V_p$ and $V_n$ may be coupled to bias circuit 120 through, for example, subtractor 114, in order for bias circuit 120 to provide bias current $I_c$. In some embodiments, bias current $I_c$ provided by bias circuit 120 may be derived from differential control voltages $V_p$ and $V_n$, thus rendering fully differential PLL 100 a self-biased PLL, thereby significantly reducing a size and power consumption of fully differential PLL 100. As illustrated by the embodiment shown in FIG. 1, subtractor 114 may be any circuitry capable of accepting differential control voltages $V_p$ and $V_n$, for example, and producing difference voltage $V_c$ substantially equal to a difference between differential control voltages $V_p$ and $V_n$, for instance, that can then be used by bias circuit 120 to provide bias current $I_c$. Bias circuit 120 may be any circuitry capable of being coupled to differential control voltages $V_p$ and $V_n$, through subtractor 114, for example, and providing bias current $I_c$ to differential charge pump 112, as described above.

DVCO 140 may be any circuitry capable of accepting differential control voltages, such as differential control voltages $V_p$ and $V_n$, for example, and producing differential signal $DOUT_{PLL}$ having a frequency proportional to, for example, a difference between differential control voltages $V_p$ and $V_n$. Differential signal $DOUT_{PLL}$ may comprise any type of waveform, for example, so long as the waveform may be used to generate PLL feedback signal $FS_{PLL}$ for comparison to reference signal $S_{ref}$ by PFD 110, as explained above. As shown in FIG. 1, differential signal $DOUT_{PLL}$ may comprise a frequency that is a multiple of a frequency of reference signal $S_{ref}$, such that differential frequency divider 116 may be used to divide down differential signal $DOUT_{PLL}$ and generate PLL feedback signal $FS_{PLL}$ coupled to PFD 110, for example, where PLL feedback signal $FS_{PLL}$ is configured to have a frequency substantially the same as reference signal $S_{ref}$, as described above. In other embodiments, however, fully differential PLL 100 may be configured such that differential signal $DOUT_{PLL}$ is substantially the same as PLL feedback signal $FS_{PLL}$, thereby eliminating a need for fully differential PLL 100 to include, for example, differential frequency divider 116. As shown in FIG. 1, differential frequency divider 116 may comprise any circuitry capable of accepting differential signal $DOUT_{PLL}$ and producing PLL feedback signal $FS_{PLL}$ comprising, for example, a frequency substantially the same as that for reference signal $S_{ref}$.

Because fully differential PLL 100 includes differential charge pump 112, DALFR 160 and DVCO 140, as well as other differentially regulated components, fully differential PLL 100 exhibits substantially better common mode noise and substrate noise rejection over other PLL configurations, which allows fully differential PLL 100 to offer substantially better jitter performance over other PLL implementations. Additionally, because fully differential PLL 100 can provide this increased performance while keeping a ratio of loop bandwidth to operating frequency and a damping factor constant over a relatively large operating frequency range, as explained above, fully differential PLL exhibits increased jitter performance over other self-biased and adaptive bandwidth PLL implementations. Furthermore, embodiments of the present inventive concepts may provide all the above performance advantages in a substantially more compact structure relative to other PLL implementations, which decreases their cost and power usage while increasing their general utility.

Figure 2:
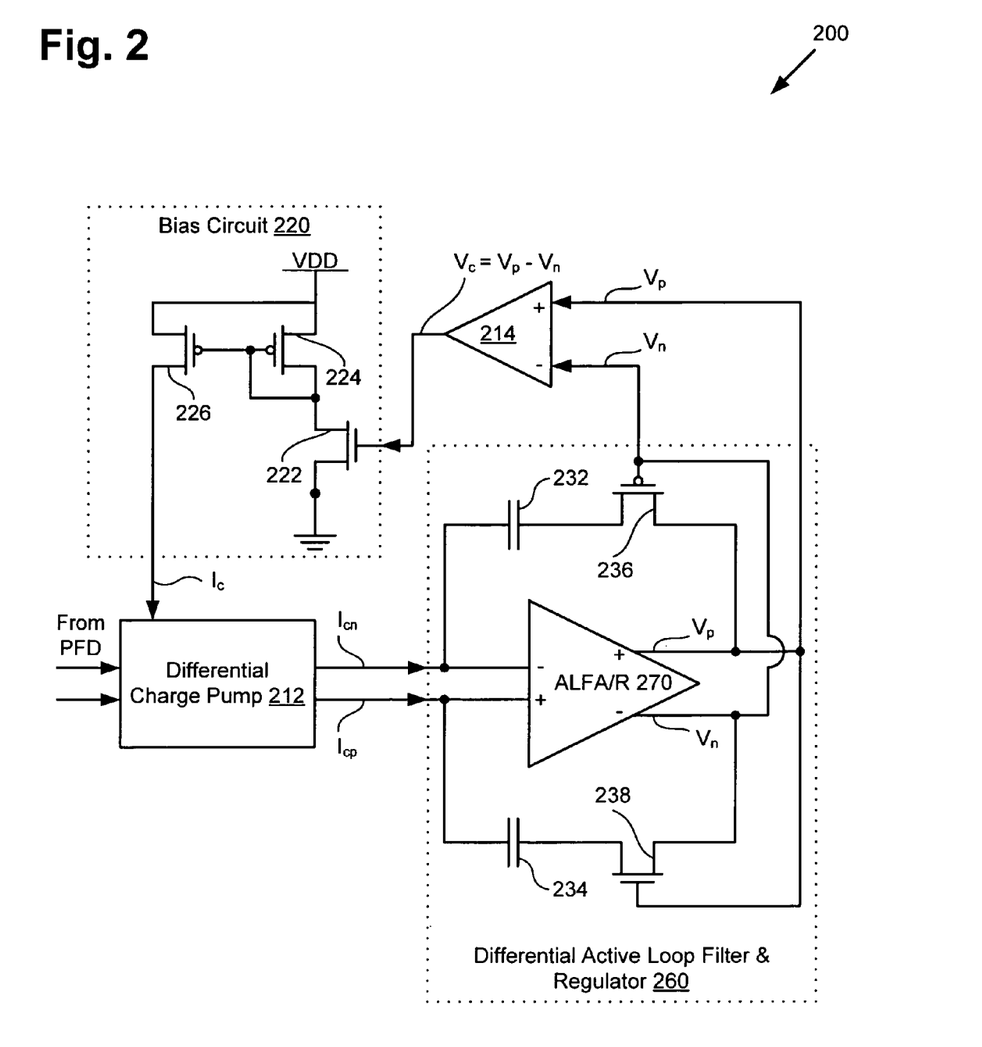
FIG. 2 presents a diagram of a portion of a fully differential adaptive bandwidth PLL with differential supply regulation, according to one embodiment of the present invention.

Moving to FIG. 2, FIG. 2 shows fully differential PLL control circuit 200 comprising differential charge pump 212, subtractor 214, bias circuit 220 and DALFR 260, which together may be configured to control operation of a fully differential PLL such as fully differential PLL 100 in FIG. 1. Differential charge pump 212, subtractor 214, bias circuit 220 and DALFR 260 correspond respectively to differential charge pump 112, subtractor 114, bias circuit 120 and DALFR 160 of FIG. 1; e.g., each corresponding structure may be configured to exhibit the same materials or features and/or operate substantially the same as its counterpart. For example, similar to differential charge pump 112 described above, differential charge pump 212 may be configured to use bias current $I_c$ from bias circuit 220 and differential control signals from a PFD, for example, to provide differential bias currents $I_{cn}$ and $I_{cp}$ to DALFR 260.

As shown in FIG. 2, DALFR 260 may comprise active loop filter/regulator (ALFA/R) 270, capacitors 232 and 234, PMOS transistor 236 and NMOS transistor 238, where DALFR 260 may be configured to serve as an adaptive bandwidth active loop filter for a fully differential PLL, for example, and to develop regulated differential control voltages $V_p$ and $V_n$ for coupling to, for example, subtractor 214 and DVCO 140, as shown in FIGS. 1 and 2.

With respect to serving as an adaptive bandwidth active loop filter, capacitor 232 and PMOS transistor 236 may form a first feedback network, for example, for a first differential output of ALFA/R 270 corresponding to differential control voltage $V_p$, and capacitor 234 and NMOS transistor 238 may form a second feedback network, for example, for a second differential output of ALFA/R 270 corresponding to differential control voltage $V_n$. Each capacitor 232 and 234 may comprise one or more capacitor networks configured to exhibit a particular capacitance, for example, and, in some embodiments, may comprise one or more MOS capacitors. Similarly, each transistor 236 and 238 may comprise one or more series connected transistors of the same P or N type.

As shown in FIG. 2, PMOS transistor 236 and NMOS transistor 238 may be configured as resistors (e.g., MOS resistors) which may exhibit effective resistances that can vary according to the differential control voltages $V_p$ and $V_n$.

For example, as shown in FIG. 2, PMOS transistor 236 may have a gate-to-source voltage substantially equal to the negative of difference voltage $V_n$ (e.g., Vgs of PMOS transistor $236 = -V_c = V_n - V_p$), while NMOS transistor 238 may have a gate-to-source voltage substantially equal to difference voltage $V_c$ (e.g., Vgs of NMOS transistor $238 = V_n = V_p - V_n$).

PMOS transistor 236 and NMOS transistor 238 can be configured such that, in the limit where the gate-to-source voltage is much greater than the drain-to-source voltage for each transistor 236 and 238, a device transconductance for both transistors is substantially the same over the operating conditions of DALFR 260. Thus, in some embodiments, PMOS transistor 236 and NMOS transistor 238 may be configured to exhibit substantially the same effective resistance for a particular pair of differential control voltages $V_p$ and $V_n$. Furthermore, capacitor 232 may be configured to exhibit substantially the same capacitance as capacitor 234, such that the first feedback network comprising capacitor 232 and PMOS transistor 236 has substantially the same impedance as the second feedback network comprising capacitor 234 and NMOS transistor 238, for any differential control voltages $V_p$ and $V_n$. As such, the first and second feedback networks may be configured to have impedances that vary similarly with differential control voltages $V_p$ and $V_n$.

As noted above, bias circuit 220 may be configured to provide bias current $I_c$, derived from differential control voltages $V_p$ and $V_n$, to differential charge pump 212, which in turn produces differential bias currents $I_{cn}$ and $I_{cp}$ used by DALFR 260, for example, to develop differential control voltages $V_p$ and $V_n$. As such, the first and second feedback networks, in conjunction with bias circuit 220, may be configured to provide a bandwidth for DALFR 260 that automatically adapts to an operating frequency of an associated fully differential PLL, such as fully differential PLL 100 in FIG. 1, where an operating frequency of fully differential PLL 100 may be determined by differential control voltages $V_p$ and $V_n$ developed by DALFR 260 and provided to DVCO 140 in FIG. 1, for example.

Thus, DALFR 260 may be configured, in conjunction with other components of fully differential PLL control circuit 200, to provide adaptive bandwidth loop filtering for a fully differential PLL, such as fully differential PLL 100 in FIG. 1, where a ratio of loop bandwidth to operating frequency and a damping factor of fully differential PLL 100 are substantially constant over a relatively large operating frequency range. Moreover, because such loop bandwidth tracks differential control voltages $V_p$ and $V_n$, as described above, fully differential PLL 100 including fully differential PLL control circuit 200 offers adaptive loop bandwidth concomitant with differential supply regulation, which provides increased jitter performance, as explained above.

Also shown in FIG. 2 are subtractor 214 and bias circuit 220 providing bias current $I_c$ to differential charge pump 212. In one embodiment, such as that shown in FIG. 2, bias circuit 220 may comprise a relatively simple and small circuit configured to derive bias current $I_c$ from differential control voltages $V_p$ and $V_n$. Because bias circuit 220 may derive bias current $I_c$ from differential control voltages $V_p$ and $V_n$, using subtractor 214, for example, bias circuit 220 can take advantage of the differential supply regulation provided by DALFR 260, for example, to provide bias current $I_c$ without incorporating common mode and/or substrate noise into bias current $I_c$. The isolation of this noise from differential charge pump 212, for example, provides an additional increase in jitter performance for fully differential PLL control circuit 200, as discussed above. Moreover, because bias circuit 220 may derive bias current $I_c$ from differential control voltage $V_p$ and $V_n$ rather than, for example, separate current generating circuitry, embodiments of the present invention can be fabricated using substantially less die space than other PLL implementations, as well as less power during typical operation.

As shown in FIG. 2, bias circuit 220 for fully differential PLL control circuit 200 may comprise, for example, NMOS transistor 222 coupled to differential control voltages $V_p$ and $V_n$ through, for example, subtractor 214, and PMOS transistor 224 in series with NMOS transistor 222 and coupled to PMOS transistor 226. For example, PMOS transistor 224 may be coupled to PMOS transistor 226 in such a way as to form a gate tied pair of PMOS transistors, with both gates referenced to a drain of PMOS transistor 224, for example, thereby ensuring that a current passing through PMOS transistor 224 is substantially related to bias current $I_c$ passing through PMOS transistor 226. By adjusting, for example, fabrication parameters of each of the transistors 222, 224 and 226, bias circuit 220 may be configured to provide bias current $I_c$ that is configured to designate a particular operating frequency range for fully differential PLL control circuit 200, for example. It should be noted that, as can be seen from the above explanation, bias circuit 220 may be configured such that bias current $I_c$ scales with differential control voltages $V_p$ and $V_n$, and so scales with an operating frequency of a constituent fully differential PLL, such as fully differential PLL 100 in FIG. 1. Thus both bandwidth and power of fully differential PLL control circuit 200 scale with operating frequency of a constituent fully differential PLL, such as fully differential PLL 100 in FIG. 1.

Figure 3:
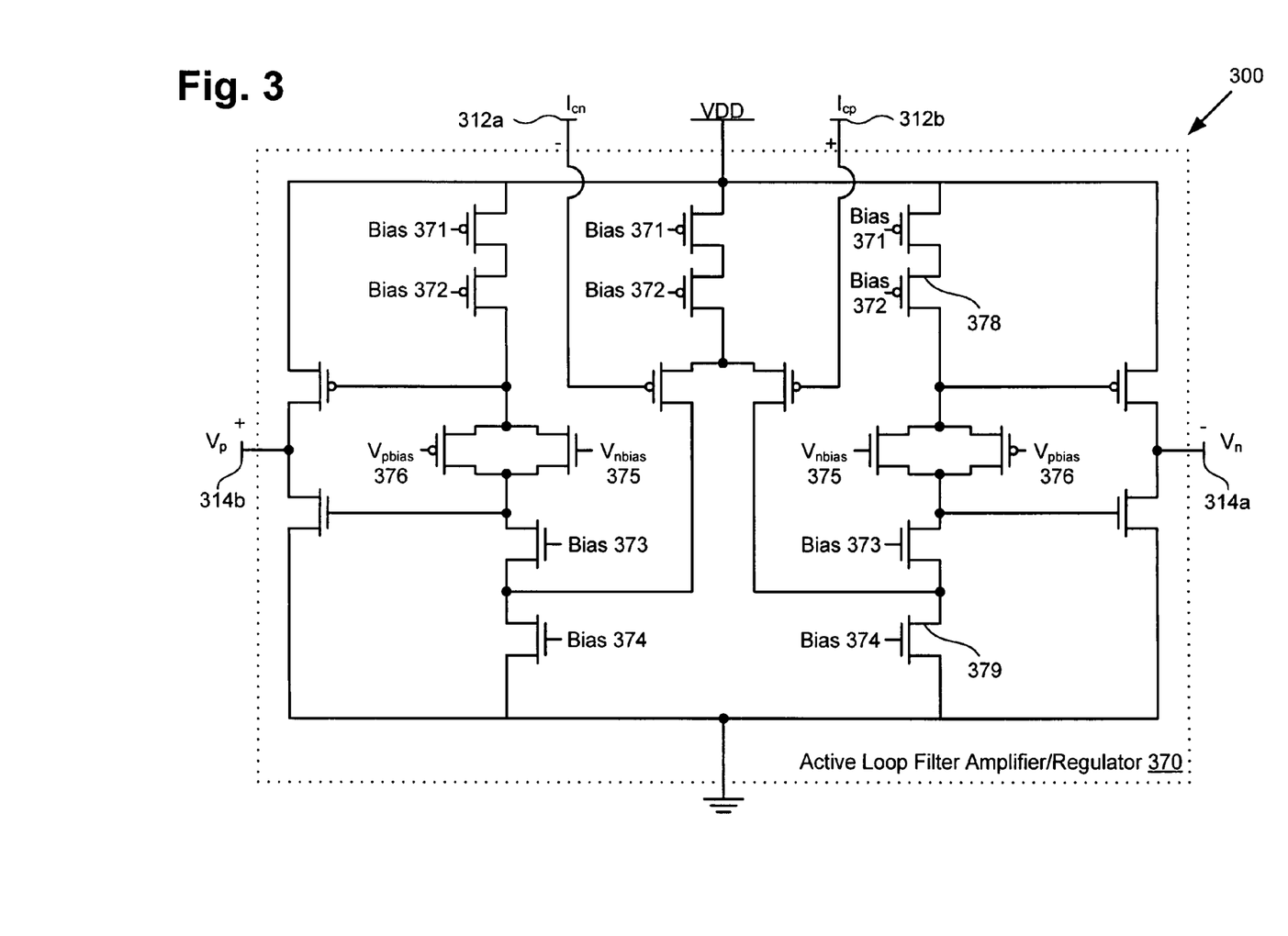
FIG. 3 presents a schematic of an active loop filter amplifier/regulator for a fully differential adaptive bandwidth PLL with differential supply regulation, according to one embodiment of the present invention.

ALFA/R 270 of DALFR 260 in FIG. 2 may comprise any amplifier circuitry capable of accepting differential bias currents $I_{cn}$ and $I_{cp}$ and producing, in combination with capacitors 232 and 234 and transistors 236 and 238, regulated differential control voltages $V_p$ and $V_n$, as shown in FIG. 2. For example, ALFA/R 270 may comprise a class AB fully differential amplifier. One embodiment of such amplifier circuitry is detailed in FIG. 3. ALFA/R 370 in FIG. 3 corresponds to ALFA/R 270 in FIG. 2; e.g., each corresponding structure may be configured to exhibit the same materials or features and/or operate substantially the same as its counterpart. As shown in FIG. 3, ALFA/R 370 shows an arrangement of PMOS transistors 378 and NMOS transistors 379 that may be configured to accept differential inputs 312a and 312b, corresponding respectively to differential bias currents $I_{cn}$ and $I_{cp}$, and to develop regulated differential outputs 314b and 314a corresponding respectively to differential control voltages $V_p$ and $V_n$.

Also shown in FIG. 3 are biases 371 and 372 coupled to the top two rows of PMOS transistors, biases 373 and 374 coupled to the bottom two rows of NMOS transistors, $V_{pbias}$ 376 coupled to the middle row of PMOS transistors, and $V_{nbias}$ 375 coupled to the middle row of NMOS transistors, as illustrated in FIG. 3. All biases 371 through 376 may be set through element coupling to supply voltage VDD and ground, such that ALFA/R may provide regulated differential outputs 314b and 314a while rejecting substantially all common mode noise and substrate noise. Furthermore, as can be seen by the embodiment shown in FIG. 3, ALFA/R 370 may be configured such that regulated differential outputs 314b and 314a may range substantially up to a transistor saturation voltage below supply voltage VDD, thereby developing an increased range of corresponding differential control voltages $V_p$ and $V_n$ provided to, for example, DVCO 140 in FIG. 1. As such, ALFA/R 370 may be configured to provide an increased operating frequency range for a fully differential PLL, such as fully differential PLL 100 in FIG. 1, by providing an increased range of differential control voltages and by increasing jitter performance through noise rejection. Furthermore, as can be seen from FIG. 3, ALFA/R 370 may be configured to provide an increased range of differential control voltages without incurring the cost and space of additional power circuitry.

Figure 4:
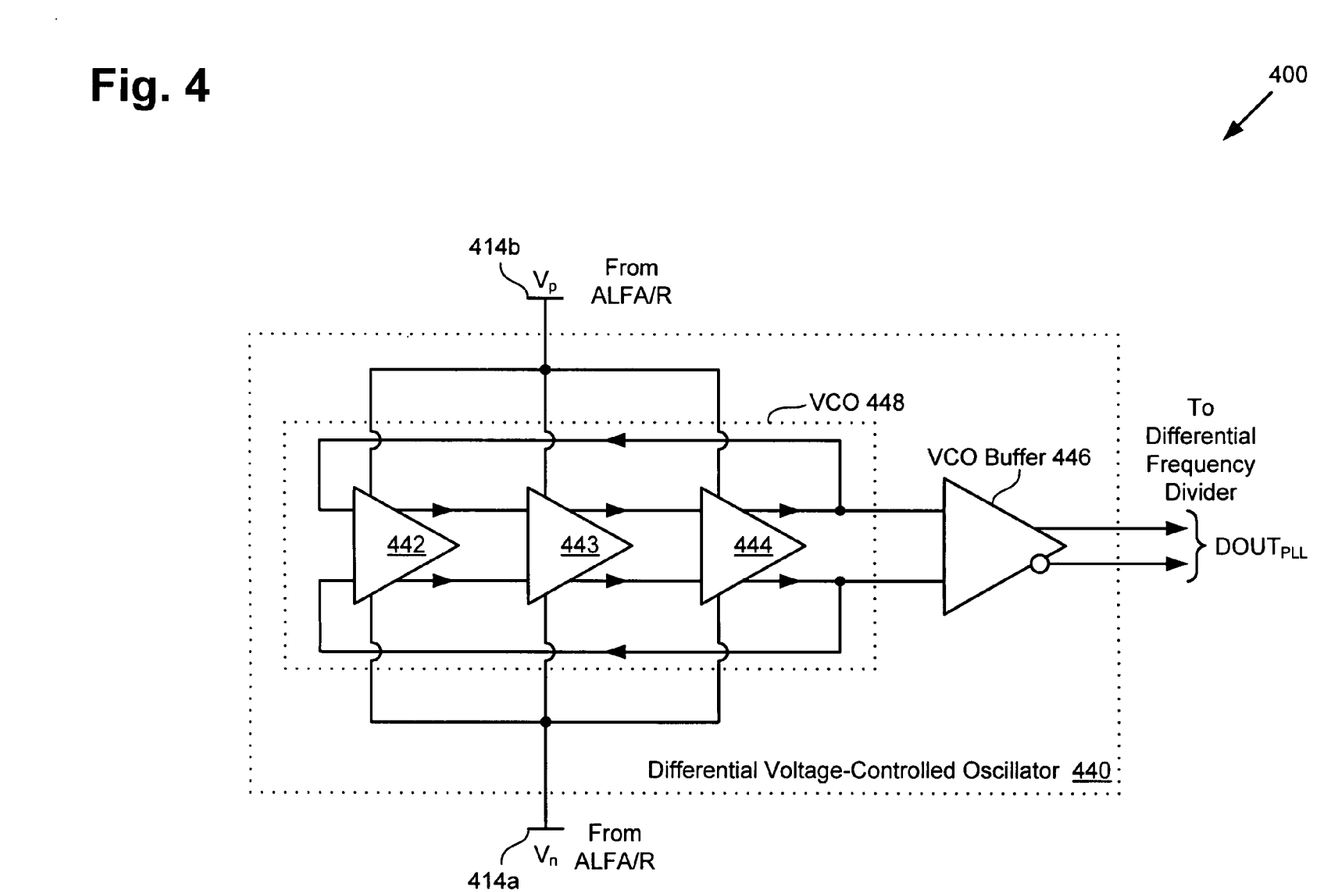
FIG. 4 presents a diagram of a differential voltage-controlled oscillator for a fully differential adaptive bandwidth PLL with differential supply regulation, according to one embodiment of the present invention.

Turning to FIG. 4, FIG. 4 shows DVCO 440 corresponding to DVCO 140 in FIG. 1; e.g., each structure may be configured to exhibit the same materials or features and/or operate substantially the same as its counterpart. As presented in FIG. 4, in one embodiment, DVCO 440 may comprise a differential inverter-ring voltage controlled oscillator, which may include ring-coupled differential inverters 442, 443 and 444 and VCO buffer 446. Ring-coupled differential inverters are particularly advantageous with respect to low power and small size PLL implementations because they may be implemented relatively compactly. Differential inputs 414b and 414a may be configured to accept differential control voltages $V_p$ and $V_n$, developed by DALFR 260 of FIG. 2 for example, and to distribute them to ring-coupled differential inverters 442, 443 and 444.

A speed at which each inverter changes state may be substantially proportional to, for example, the applied differential control voltages $V_p$ and $V_n$, such that a differential waveform generated by the ring-coupled differential inverters 442, 443 and 444 has a frequency substantially linearly proportional to a difference voltage $V_c = V_p - V_n$. The differential waveform generated by the ring-coupled differential inverters 442, 443 and 444 may then be buffered by differential VCO buffer 446, for example, which may be configured to provide a buffered differential signal $DOUT_{PLL}$ to, for instance, differential frequency divider 116 in FIG. 1. For example, VCO buffer may comprise a current mode logic (CML) to complementary metal-oxide-semiconductor (CMOS) logic type differential converter, thereby providing a rail-to-rail differential signal $DOUT_{PLL}$, for instance. Because DVCO 440 may be configured to be fully differential, e.g., accepting differential control voltages and providing a differential signal, embodiments of DVCO 440 may provide increased jitter performance due to common mode noise and substrate noise rejection, as discussed above. Furthermore, because DVCO 440 may be used in conjunction with a fully differential PLL control circuit for a fully differential PLL, such as fully differential control circuit 200 and fully differential PLL 100 of FIGS. 2 and 1, embodiments of the present invention may take advantage of the fully differential nature of the associated circuitry to offer substantially increased jitter performance relative to other PLL implementations.

As can be seen from FIGS. 1 through 4 and the description above, embodiments of the present invention may be configured to provide a compact fully differential adaptive PLL with differential supply regulation, with all the attendant increases in jitter performance described above. However, in addition to the above, fully differential PLL control circuit 200 of FIG. 2 and DVCO 440 of FIG. 4 illustrate a further benefit of embodiments of the present inventive concepts that include, for example, embodiments of fully differential PLL control circuit 200 and DVCO 440. For example, with respect to a fully differential PLL comprising embodiments of fully differential PLL control circuit 200 and DVCO 440, it can be shown that a ratio of loop bandwidth to operating frequency for that fully differential PLL may be substantially determined by a ratio of capacitances of DALFR 260 and DVCO 440, for example, which are largely independent of process, voltage and temperature (PVT) variations where the components are integrated into the same semiconductor die. Similarly, it can be shown that a damping factor for that fully differential PLL may also be substantially determined by a similar ratio of capacitances. This relative imperviousness to PVT variations serves to decrease long term tracking errors and thus decreases a potential for PLL operating frequency errors for such a fully differential PLL implementation.

From the above description of the invention it is manifest that various techniques can be used for implementing the concepts of the present invention without departing from its scope. Moreover, while the invention has been described with specific reference to certain embodiments, a person of ordinary skill in the art would recognize that changes can be made in form and detail without departing from the spirit and the scope of the invention. As such, the described embodiments are to be considered in all respects as illustrative and not restrictive. It should also be understood that the invention is not limited to the particular embodiments described herein, but is capable of many rearrangements, modifications, and substitutions without departing from the scope of the invention.

What is claimed is:

1. A fully differential adaptive bandwidth phase locked loop (PLL) with differential supply regulation, the PLL comprising:
    a differential active loop filter and regulator (DALFR) coupled to an output of a differential charge pump;
    a differential voltage-controlled oscillator (DVCO) coupled to differential control voltages developed by the DALFR; and
    a bias circuit coupled to the differential control voltages and providing a bias current to the differential charge pump;
    wherein the DALFR includes:
        an active loop filter amplifier/regulator (ALFA/R);
        first and second feedback networks for respective first and second differential outputs of the ALFA/R;
        the first feedback network including a MOS capacitor and a PMOS transistor that is configured as a MOS resistor;
        the PMOS transistor having a gate coupled to the second differential output of the ALFA/R.

2. The PLL of claim 1, wherein the bias current is derived from the differential control voltages.

3. The PLL of claim 1, wherein the differential charge pump comprises a fully differential all NMOS charge pump.

4. The PLL of claim 1, wherein the DALFR comprises:
a plurality of capacitors and resistors configured to form first and second feedback networks for respective first and second differential outputs of the ALFA/R.

5. The PLL of claim 1, wherein the DALFR comprises:
the second feedback network including a MOS capacitor and an NMOS transistor that is configured as a MOS resistor;
the NMOS transistor having a gate coupled to the first differential output of the ALFA/R.

6. The PLL of claim 1, wherein the bias circuit comprises:
a first transistor coupled to the differential control voltages;
a second transistor in series with the first transistor and coupled to a third transistor;
the third transistor being configured to provide the bias current to the differential charge pump.

7. The PLL of claim 1, wherein the bias circuit comprises:
a first transistor coupled to the differential control voltages;
second and third transistors forming a gate tied pair of PMOS transistors;
the second transistor in series with the first transistor;
the third transistor being configured to provide the bias current to the differential charge pump.

8. The PLL of claim 1, wherein the DVCO comprises a differential inverter-ring voltage controlled oscillator.

9. The PLL of claim 1, wherein the DVCO comprises a differential output buffer.

10. The PLL of claim 1, further comprising a differential frequency divider coupled to the DVCO.

11. The PLL of claim 1, further comprising a differential phase frequency detector coupled to the differential charge pump.

12. The PLL of claim 1, wherein the DALFR is configured to develop differential control voltages ranging substantially up to a transistor saturation voltage below a supply voltage for the PLL, thereby increasing an operating frequency range of the PLL.

13. The PLL of claim 1, wherein the DALFR, the DVCO and the bias circuit are configured so that a ratio of loop bandwidth to operating frequency for the PLL is substantially constant over an operating frequency range of the PLL.

14. The PLL of claim 1, wherein the DALFR, the DVCO and the bias circuit are configured so that a damping factor for the PLL is substantially constant over an operating frequency range of the PLL.

15. A fully differential adaptive bandwidth phase locked loop (PLL) with differential supply regulation, the PLL comprising:
    a differential active loop filter and regulator (DALFR) coupled to an output of a differential charge pump;
    a differential voltage-controlled oscillator (DVCO) coupled to differential control voltages developed by the DALFR; and
    a bias circuit coupled to the differential control voltages and providing a bias current to the differential charge pump;
    wherein the DALFR includes:
        an active loop filter amplifier/regulator (ALFA/R);
        first and second feedback networks for respective first and second differential outputs of the ALFA/R;
        the second feedback network including a MOS capacitor and an NMOS transistor that is configured as a MOS resistor;
        the NMOS transistor having a gate coupled to the first differential output of the ALFA/R.

16. The PLL of claim 15, wherein the bias current is derived from the differential control voltages.

17. The PLL of claim 15, wherein the differential charge pump comprises a fully differential all NMOS charge pump.

18. The PLL of claim 15, wherein the DALFR comprises:
a plurality of capacitors and resistors configured to form first and second feedback networks for respective first and second differential outputs of the ALFA/R.

19. The PLL of claim 15, wherein the bias circuit comprises:
a first transistor coupled to the differential control voltages;
a second transistor in series with the first transistor and coupled to a third transistor;
the third transistor being configured to provide the bias current to the differential charge pump.

20. A fully differential adaptive bandwidth phase locked loop (PLL) comprising:
    a differential active loop filter and regulator (DALFR) including:
        an active loop filter amplifier/regulator (ALFA/R);
        first and second feedback networks for respective first and second differential outputs of the ALFA/R;
        the first feedback network including a MOS capacitor and a PMOS transistor that is configured as a MOS resistor, and the PMOS transistor having a gate coupled to the second differential output of the ALFA/R.

* * * * *